United States Patent
Alhussien et al.

(10) Patent No.: US 10,180,868 B2
(45) Date of Patent: Jan. 15, 2019

(54) ADAPTIVE READ THRESHOLD VOLTAGE TRACKING WITH BIT ERROR RATE ESTIMATION BASED ON NON-LINEAR SYNDROME WEIGHT MAPPING

(71) Applicant: Seagate Technology LLC, Cupertino, CA (US)

(72) Inventors: AbdelHakim S. Alhussien, San Jose, CA (US); Sundararajan Sankaranarayanan, Fremont, CA (US); Erich F. Haratsch, San Jose, CA (US)

(73) Assignee: Seagate Technology LLC, Cupertino, CA (US)

( * ) Notice: Subject to any disclaimer, the term of this patent is extended or adjusted under 35 U.S.C. 154(b) by 0 days.

(21) Appl. No.: 15/639,019

(22) Filed: Jun. 30, 2017

(65) Prior Publication Data

US 2018/0011753 A1    Jan. 11, 2018

Related U.S. Application Data

(63) Continuation-in-part of application No. 15/205,654, filed on Jul. 8, 2016.

(51) Int. Cl.
   *G06F 11/07*        (2006.01)
   *G11C 16/08*        (2006.01)
   (Continued)

(52) U.S. Cl.
   CPC ........ *G06F 11/076* (2013.01); *G06F 11/0727* (2013.01); *G06F 11/0775* (2013.01); *G06F 11/1012* (2013.01); *G11C 11/5642* (2013.01); *G11C 16/08* (2013.01); *G11C 16/26* (2013.01); *G11C 16/28* (2013.01); *G11C 29/021* (2013.01); *G11C 29/028* (2013.01); *G11C 29/52* (2013.01); *H03M 13/1108* (2013.01); *H03M 13/1111* (2013.01); *H03M 13/3707* (2013.01); *H03M 13/3723* (2013.01); *H03M 13/612* (2013.01); *H03M 13/6325* (2013.01); *G11C 2029/0409* (2013.01); *G11C 2029/0411* (2013.01)

(58) Field of Classification Search
CPC ............... G06F 11/076; G06F 11/0727; G06F 11/0775; G11C 11/5642; G11C 16/08; G11C 16/26
See application file for complete search history.

(56) References Cited

U.S. PATENT DOCUMENTS 6,466,614 B1 * 10/2002 Smith ...................... H04B 3/46
                                                                                           375/224
8,243,511 B2    8/2012   KatzPatapoutian et al.
(Continued)

OTHER PUBLICATIONS

Peleato et al., "Towards Minimizing Read Time for Nand Flash".

*Primary Examiner* — Kyle Vallecillo
(74) *Attorney, Agent, or Firm* — Ryan, Mason & Lewis, LLP (57) ABSTRACT

Adaptive read threshold voltage tracking techniques are provided that employ bit error rate estimation based on a non-linear syndrome weight mapping. An exemplary device comprises a controller configured to determine a bit error rate for at least one of a plurality of read threshold voltages in a memory using a non-linear mapping of a syndrome weight to the bit error rate for the at least one of the plurality of read threshold voltages.

20 Claims, 9 Drawing Sheets

(51) Int. Cl.
*G11C 11/56* (2006.01)
*G11C 16/26* (2006.01)
*G06F 11/10* (2006.01)
*G11C 16/28* (2006.01)
*G11C 29/02* (2006.01)
*G11C 29/52* (2006.01)
*H03M 13/11* (2006.01)
*H03M 13/37* (2006.01)
*H03M 13/00* (2006.01)
*G11C 29/04* (2006.01)

(56) References Cited

U.S. PATENT DOCUMENTS

| | | |
|---|---|---|
| 8,769,380 B1 | 7/2014 | Burd |
| 9,037,946 B2 | 5/2015 | Jeon et al. |
| 9,043,678 B2 | 5/2015 | Jeon et al. |
| 9,209,835 B2 | 12/2015 | Alhussien et al. |
| 9,236,099 B2 | 1/2016 | Alhussien et al. |
| 9,263,138 B1 | 2/2016 | Wilson et al. |
| 9,378,765 B2 | 6/2016 | Cai |
| 9,431,130 B2 | 8/2016 | Sakurada |
| 9,583,217 B2 | 2/2017 | Lin et al. |
| 9,633,740 B1 | 4/2017 | Alhussien et al. |
| 9,697,905 B2 * | 7/2017 | Sharon ................. G06F 11/1048 |
| 9,728,263 B2 * | 8/2017 | Sharon ................. G11C 16/26 |
| 9,768,807 B2 | 9/2017 | Zhang |
| 2011/0182119 A1 | 7/2011 | Strasser et al. |
| 2012/0317460 A1 | 12/2012 | Chilappagari et al. |
| 2013/0139035 A1 | 5/2013 | Zhong et al. |
| 2013/0343131 A1 | 12/2013 | Wu et al. |
| 2014/0229131 A1 | 8/2014 | Cohen et al. |
| 2014/0269052 A1 | 9/2014 | Dusija et al. |
| 2014/0281750 A1 | 9/2014 | Jeon et al. |
| 2014/0281772 A1* | 9/2014 | Jeon ................... G11C 16/3404 714/721 |
| 2014/0355340 A1* | 12/2014 | Sharon ................... G11C 16/26 365/185.03 |
| 2015/0039842 A1 | 2/2015 | Fitzpatrick et al. |
| 2015/0052387 A1 | 2/2015 | Kern et al. |
| 2015/0085571 A1* | 3/2015 | Hu ......................... G11C 16/26 365/185.03 |
| 2015/0085573 A1* | 3/2015 | Sharon ................ G06F 11/1048 365/185.03 |
| 2015/0127883 A1 | 5/2015 | Chen et al. |
| 2015/0149840 A1 | 5/2015 | Alhussien et al. |
| 2015/0149855 A1* | 5/2015 | Alhussien ........... G06F 11/1012 714/758 |
| 2015/0149871 A1* | 5/2015 | Chen .................. G06F 11/1068 714/773 |
| 2015/0162057 A1 | 6/2015 | Alhussien et al. |
| 2015/0287453 A1 | 10/2015 | Wu et al. |
| 2017/0148510 A1* | 5/2017 | Bazarsky ............ G11C 11/5642 |

* cited by examiner

ADAPTIVE READ THRESHOLD VOLTAGE TRACKING WITH BIT ERROR RATE ESTIMATION BASED ON NON-LINEAR SYNDROME WEIGHT MAPPING

CROSS-REFERENCE TO RELATED APPLICATIONS

The present application is a continuation-in-part of U.S. patent application Ser. No. 15/205,654, filed Jul. 8, 2016, entitled "Read Retry Operations with Estimation of Written Data Based on Syndrome Weights;" and is related to U.S. patent application Ser. No. 14/928,284, filed Oct. 30, 2015, now U.S. Pat. No. 9,818,488, entitled "Read Threshold Voltage Adaptation Using Bit Error Rates Based On Decoded Data," each incorporated by reference herein in its entirety.

FIELD

The field relates generally to solid state storage media and, more particularly, to adjustments of read threshold voltages for such solid state storage media.

BACKGROUND

Solid state storage devices use analog memory cells to store data. Each memory cell stores a storage value, such as an electrical voltage. The storage value represents the information stored in the memory cell. Many solid state storage devices distinguish between different binary values that a memory cell may store based on a read voltage level of the memory cell. The range of possible storage values for each memory cell is typically divided into threshold regions, with each region separated by a read threshold voltage and corresponding to one or more data bit values. Ideally, all of the memory cells in a given solid state storage device have identical read threshold voltages for the logical bit values stored. In practice, however, the read threshold voltages differ across the cells in probability distributions along the read threshold voltage axis (e.g., "read threshold voltage distributions") that are similar to a Gaussian distribution.

In addition, solid state storage devices can shift over time. For example, memory cell leakage, memory cell damage and other disturbances to memory cells can alter the read voltage levels of the memory cells. Thus, the read threshold voltages can shift over time. If the read voltage level of a memory cell shifts past a read threshold voltage, a data error occurs, as the value of the data read from the memory cell is different than the value of the data that was written to the memory cell.

A number of techniques have been proposed or suggested for adapting to the changes in the read threshold voltages to maintain a desired performance level. Existing adaptive tracking algorithms are designed to track variations in the solid state storage channel and consequently, to help maintain a set of updated channel parameters. The updated channel parameters are used, for example, to adjust read threshold voltages.

A need exists for improved techniques for adapting read threshold voltages that estimate the bit error rate using a non-linear mapping of syndrome weights.

SUMMARY

Adaptive read threshold voltage tracking techniques are provided that employ bit error rate estimation based on a non-linear syndrome weight mapping. In one embodiment, a device comprises a controller configured to determine a bit error rate for at least one of a plurality of read threshold voltages in a memory using a non-linear mapping of a syndrome weight to the bit error rate for at least one of the plurality of read threshold voltages.

Other illustrative embodiments include, without limitation, apparatus, systems, controllers, methods and computer program products comprising processor-readable storage media.

DETAILED DESCRIPTION

Illustrative embodiments will be described herein with reference to exemplary solid state storage devices and associated storage media, controllers, and other processing devices. It is to be appreciated, however, that these and other embodiments are not restricted to the particular illustrative system and device configurations shown. Accordingly, the term "solid state storage device" as used herein is intended to be broadly construed, so as to encompass, for example, any storage device implementing the bit error rate profiling techniques described herein. Numerous other types of storage systems are also encompassed by the term "solid state storage device" as that term is broadly used herein.

Various embodiments of the disclosure are directed to threshold voltage adjustment techniques for solid state memory devices, such as single-level cell (SLC) or multi-level cell (MLC) NAND (Not And) flash memory devices. As used herein, a multi-level cell flash memory comprises a memory where each memory cell stores two or more bits. While the disclosure is illustrated herein using memory cells that store an analog value as a voltage, the present disclosure can be employed with any storage mechanism for memory devices, such as the use of voltages or currents to represent stored data, as would be apparent to a person of ordinary skill in the art.

Embodiments of the disclosure adjust a read threshold voltage for a memory using bit error rates based on a non-linear mapping of syndrome weights to address variations in read threshold voltages as the solid state storage media evolves and/or degrades. In one exemplary embodiment, a controller adjusts a read threshold voltage for a memory using bit error rates that are obtained based, at least in part, on decoded data for a plurality of read threshold voltages. In at least one embodiment, a syndrome weight of a particular page is used to determine a bit error rate and a corresponding adjusted read threshold voltage.

As will be described, in one or more illustrative embodiments, bit error rate profiling is performed using a non-linear mapping of syndrome weights, to thereby compute read threshold voltages with improved robustness. In one or more embodiments, the non-linear mapping of the syndrome weights is performed if a hard decision decoder does not converge for a read value obtained for a current read threshold voltage.

In some embodiments, the non-linear mapping of the syndrome weights allows bit error rates for multiple pages using different code rates to be combined in a single bit error rate profile. In addition, the non-linear mapping of the syndrome weight allows the bit error rates determined using the syndrome weight to be merged in a single bit error rate profile with bit error rates based on decoded data. Thus, the bit error rate determined using the syndrome weight mapping is optionally merged in a single bit error rate profile based on bit error rates for multiple read threshold voltages bit error rates based on decoded data.

U.S. patent application Ser. No. 14/928,284, filed Oct. 30, 2015, now U.S. Pat. No. 9,818,488, entitled "Read Threshold Voltage Adaptation Using Bit Error Rates Based On Decoded Data," incorporated by reference herein, teaches that the bit error rate for the current read threshold voltage $V_i$ ($BER_S(V_i)$) can be estimated from the syndrome weight of the given page $P_j$. Generally, a syndrome is an estimate of the number of bits in error. The syndrome weight can be obtained, for example, from a syndrome weight calculator or a hard decision decoder for a specified number of iterations. In further variations, syndrome weights can be computed without first checking for convergence, or syndrome weight-based estimation of error counts can be omitted entirely. Thus, in various implementations, the syndrome weight-based estimation of error counts and the bit error rate computation for the current read threshold voltage $V_i$ can be performed independently, or can be combined.

Considered individually, each non-volatile memory cell has a particular stored (programmed) charge that corresponds to a device threshold voltage for that cell, and further corresponds to the logical bit values being stored in the cell. While, ideally, all of the cells in the non-volatile memory would have identical device threshold voltages for the logical bit values stored, in practice, for a variety of reasons, the device threshold voltages follow a probability distribution, e.g. a Gaussian distribution. Thus, considered in aggregate across a large number of cells, such as of a read unit, there are as many device threshold voltage distributions (e.g., Gaussian probability curves) as there are states per cell (two states per bit of storage per cell). That is, for N-bits per cell of storage, there are $2^N$ states and the same number of device threshold voltage distributions. Thus, $2^N-1$ different read reference voltages may be needed by read circuits in the non-volatile memory to distinguish between the $2^N$ states.

The device threshold voltage distributions vary from their initial/nominal distributions by one or more factors, such as read disturb, write disturb, and retention loss. More particularly, over time, temperature, and other factors related to use, the location of each of the device threshold voltage distributions can change with respect to the device threshold voltage axis. Such changes increase the likelihood of read errors that are performed using a read reference voltage value for the read threshold that was previously established based on the nominal device threshold voltage distribution. In some embodiments, when a hard-decision uncorrectable error is encountered in a read unit read from non-volatile memory, a series of read retry operations is performed to recover the read unit. The read retry operations include the controller re-reading the read unit with different reference voltages, as adjusted based on channel tracking.

The read retry reference voltage adjustment disclosed herein can be applied to both single-level cell (SLC) flash memories, where N=1, and to multi-level cell (MLC) flash memories, where N>1. Single-level cell memories store one bit per cell of storage, have two device threshold voltage distributions (one for zeroes and another for ones), and use a single read threshold, read reference voltage $V_{REF0}$. From lower to higher device threshold voltages, the two device threshold voltage distributions are known as the E (Erased) state and D1 (first Data) state. While arbitrary, a mapping or coding in some embodiments assigns logical one to the E state and logical zero to the D1 state. Thus, references to zeroes and ones are proxy references for respective decodings of the D1 state and the E state. Multi-level cell memories store more than one bit per cell, have more than two device threshold voltage distributions, and use multiple different read thresholds to distinguish the distributions. For example, a four level cell memory stores two bits per cell, has four device threshold voltage distributions, and generally uses three read thresholds (read voltage references $V_{REF1}$, $V_{REF2}$, and $V_{REF3}$). From lower to higher device threshold voltages, the four device threshold voltage distributions are known as the E (Erased), D1 (Data1), D2 (Data2), and D3 (Data3) states. While arbitrary, each of the four device threshold voltage distributions is also mapped (addressed) in accordance with a particular binary sequence, such as a Gray code sequence. Thus, references to one or more of the 11, 10, 00, and 01 states, are proxy references for respective decodings of the E, D1, D2, and D3 states.

For a single-level memory cell, a tracking module estimates the means and variances of the voltage distributions of states D1 and E, and sets the read reference voltage $V_{REF0}$ based on these distributions. The calculated $V_{REF0}$ will lie at the intersection of the distributions when zeroes (state E) and ones (state D1) are equally likely in the written data. A read control module initiates M data reads of the addressed page from the flash device to the read buffer, with the first read at a read reference voltage of $V_{REF0}$ and the subsequent read reference voltages at different levels around $V_{REF0}$ as determined by channel tracking of the means and variances of the voltage distributions of states D1 and E, or by searching for $V_{REF}$ that minimizes the bit errors of the read operation. For a multi-level memory cell, the tracking module typically estimates the means and variances of the voltage distributions of all states.

Figure 1:
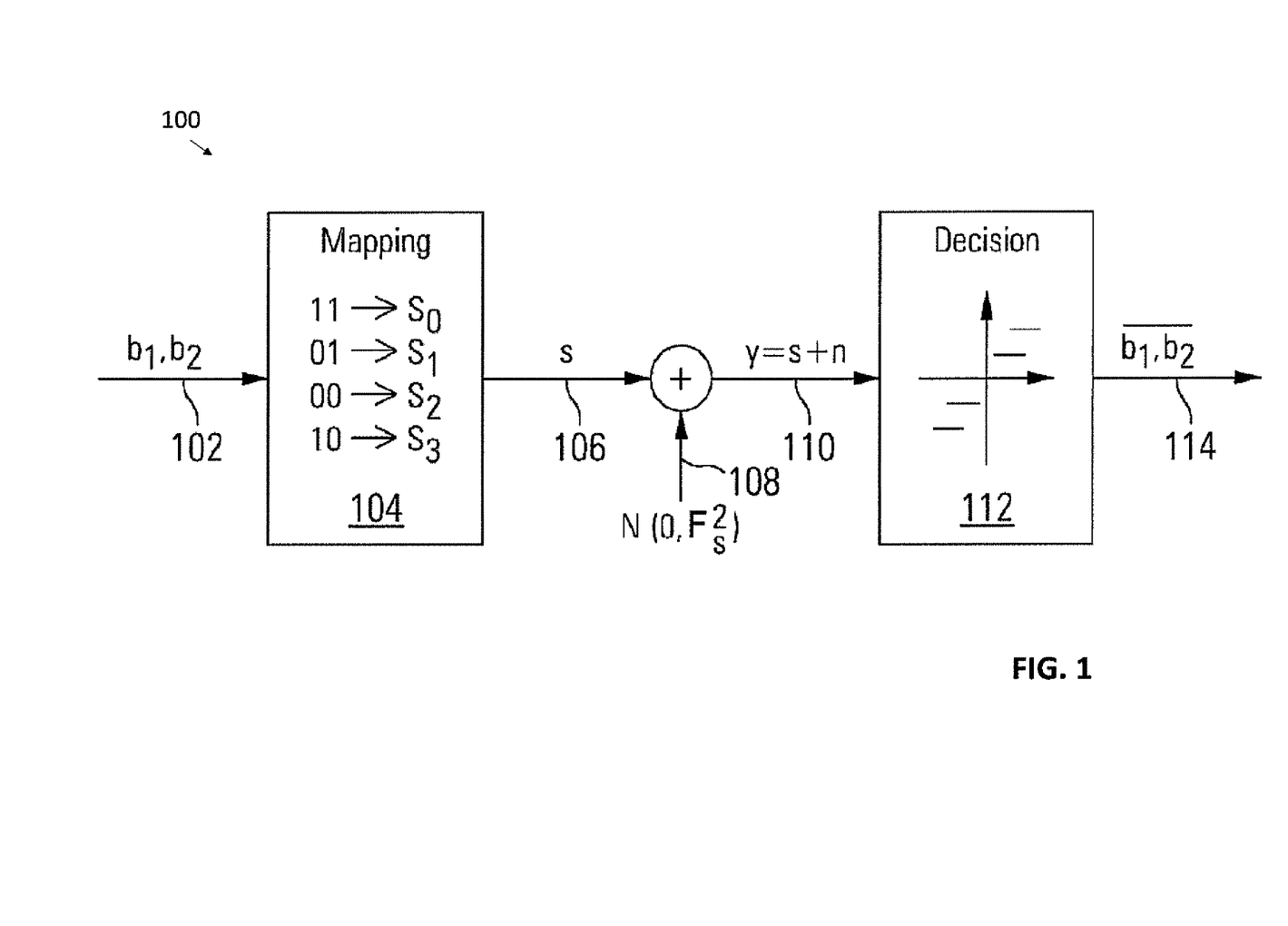
FIG. 1 illustrates a model of a non-volatile memory channel in which channel tracking can be used to adjust read retry reference voltages, in accordance with one or more embodiments of the present disclosure.

FIG. 1 illustrates a model of a non-volatile memory channel 100 in which channel tracking can be used to adjust read retry reference voltages in accordance with one or more embodiments of the present disclosure. Notably, two-bit inputs with four states are used in this example, although the read retry reference voltage adjustment disclosed herein is not limited to use with any particular bit width or number of states. For two input data bits 102, the two data bits 102 $b_1$, $b_2$ can be mapped to four possible states in a mapping 104. For example, value "11" for the two data bits 102 can be mapped to state $s_0$, value "01" to state $s_1$, value "00" to state $s_2$, and value "10" to state $s_3$. For a multi-level cell, the cell is programmed to a selected state 106 from the four possible states depending on the value of the two data bits 102. As voltages representing the selected state 106 are written to and read from the memory cell, noise 108 is added due to the programming process and other inefficiencies and disturbances, yielding a noisy cell voltage 110 y. The noise can be considered to be an additive white Gaussian noise (AWGN), with the noise variances being different depending on the signal transmitted.

Figure 2:
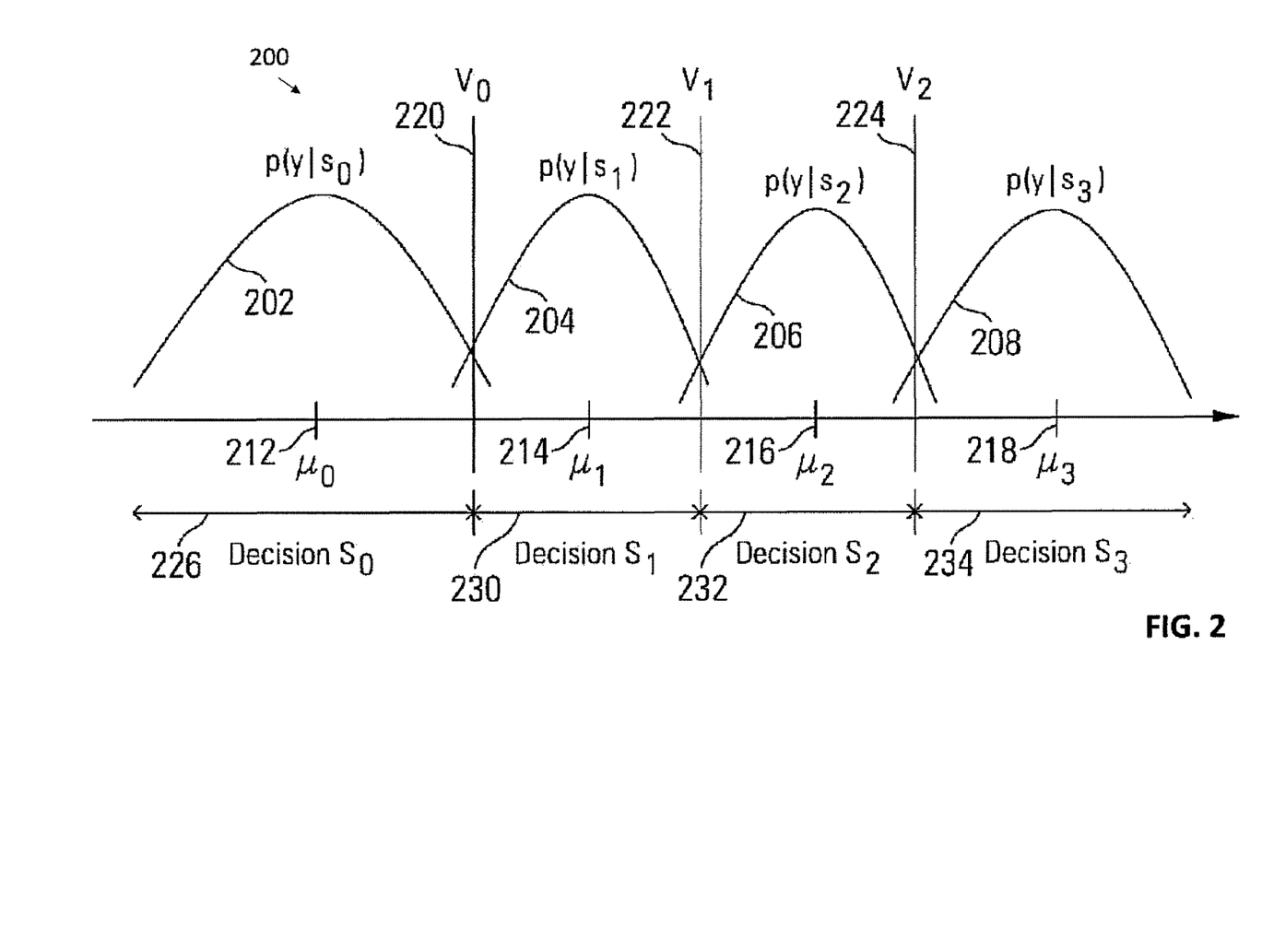
FIG. 2 is a graph of cell voltage distributions for a normal hard decision read, in accordance with some embodiments of the present disclosure.

FIG. 2 is a graph 200 of cell voltage distributions 202, 204, 206, 208 for a normal hard decision read in accordance with some embodiments of the present disclosure. The resulting voltages read from the memory cell thus appear something like the distributions 202, 204, 206, 208 shown in the graph 200 of FIG. 2, rather than four distinct discrete voltage levels corresponding to the four states at the target state voltage levels 212, 214, 216, 218. Each distribution 202, 204, 206, 208 will have a mean roughly equal to the target voltage for the state, and the variance will depend upon the noise. Because the voltages on the memory cell are not accurate, the voltages read back can vary according to the distributions 202, 204, 206, 208. In some embodiments, during the initial read of the memory cell, reference voltages $V_0$ 220, $V_1$ 222 and $V_2$ 224 are used during a read to determine the state of the memory cell, returning hard decisions about the state of the memory cell.

In general, if the read voltage is below reference voltage 220, a decision (112, FIG. 1) indicates that the memory cell is determined to be in state $S_0$ 226. If the read voltage is above reference voltage $V_0$ 220 and below reference voltage $V_1$ 222, a decision indicates that the memory cell is determined to be in state $S_1$ 230, and a corresponding bit sequence 114 is generated. If the read voltage is above reference voltage $V_1$ 222 and below reference voltage $V_2$ 224, a decision indicates that the memory cell is determined to be in state $S_2$ 232. If the read voltage is above reference voltage $V_2$ 224, a decision indicates that the memory cell is determined to be in state $S_3$ 234, and a corresponding bit sequence 114 is generated.

In some embodiments, the read operation is divided into a process of reading least significant bit (LSB) pages and most significant bit (MSB) pages. States $S_0$ 226 and $S_1$ 230 correspond to a least significant bit value of 1, states $S_2$ 232 and $S_3$ 234 correspond to a least significant bit value of 0. When reading the least significant bit, the reference voltage $V_1$ 222 is applied to the memory cell, and if the voltage on the cell is above reference voltage $V_1$ 222 the least significant bit is interpreted as having a value of 0. If the voltage on the cell is below reference voltage $V_1$ 222 the least significant bit is interpreted as having a value of 1. States $S_0$ 226 and $S_3$ 234 are less likely to result in a read error than states $S_1$ 230 and $S_2$ 232, because their distributions 202 and 208 are further from the intersection of distributions 204, 206 associated with reference voltage $V_1$ 222. When reading the most significant bit, states $S_0$ 226 and $S_3$ 234 correspond to most significant bit value of 1, and states $S_1$ 230 and $S_2$ 232 correspond to most significant bit value of 0. To read the most significant bit pages, the decision criterion is different and a pair of reference voltages $V_0$ 220 and $V_2$ 224 are applied. The levels of reference voltages $V_0$ 220, $V_1$ 222 and $V_2$ 224 are supplied by a channel tracking module in some embodiments of the disclosure.

When reference voltages $V_0$ 220, $V_1$ 222 and $V_2$ 224 are used during a read to determine the state of the memory cell, it can result in a misread due to overlapping regions for neighboring distributions. For example, if the actual written state is $S_0$ corresponding to target state voltage level 212, but the read voltage is at the upper edge of distribution 202 above reference voltage $V_0$ 220, the decision will incorrectly identify state $S_1$ 230. In these cases, if low density parity check decoding of the data read from the non-volatile memory does not converge on the correct values and correct the errors, a retry operation is initiated.

During the read retry operation, the non-volatile memory controller enters into a soft low density parity check decoding operation, in which soft data is used as the input to the low density parity check decoder. In retry, multiple reads of a memory page are performed at different read reference voltages to obtain a quantized version of the stored voltage on the cell. Afterwards, the multiple read pattern for each bit is then mapped to a log likelihood ratio (LLR) that represents the confidence level of the bit value being 0 or 1. Finally, the log likelihood ratios are passed as the soft data input to the low density parity check decoder to recover the written data.

Figure 3:
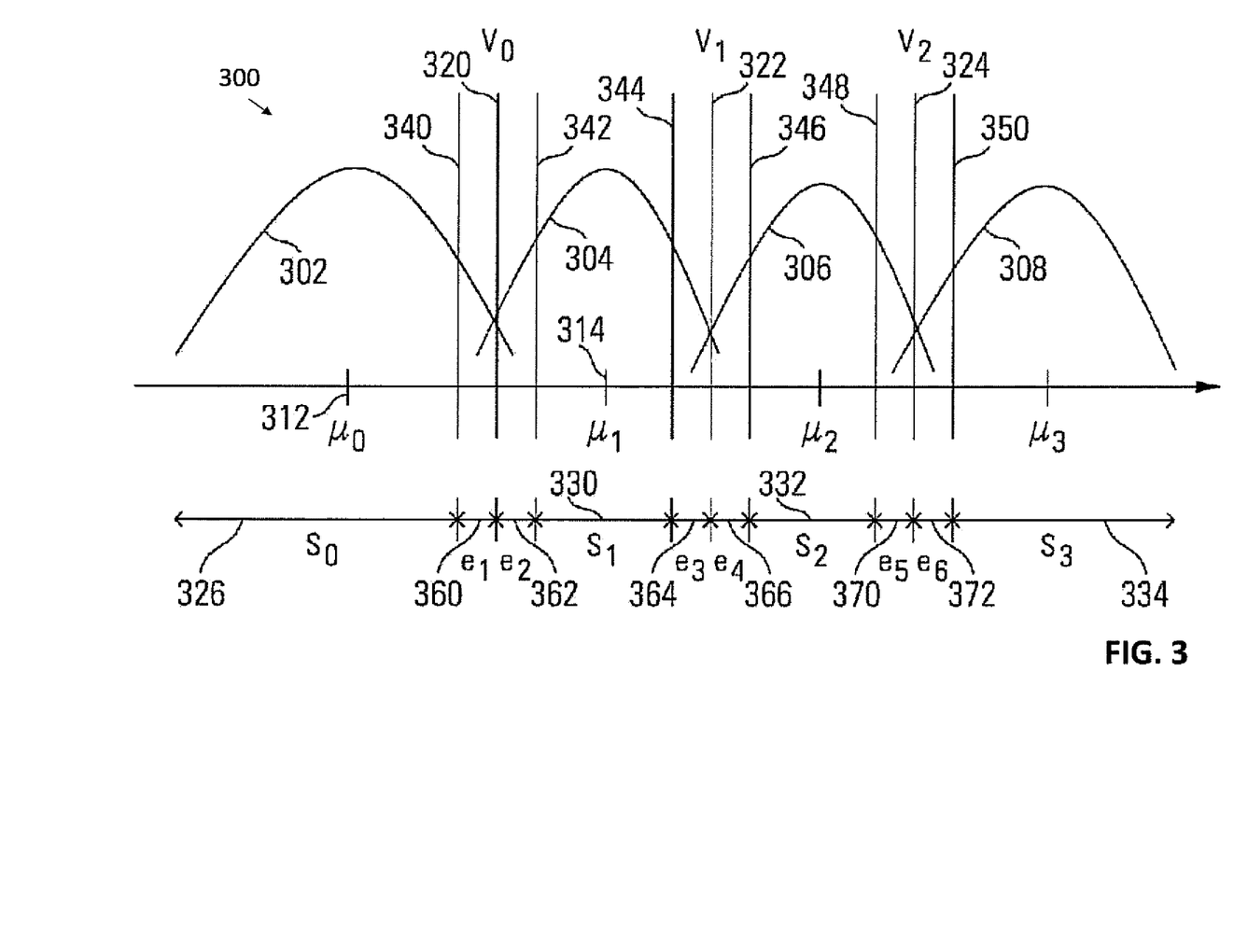
FIG. 3 is a graph of cell voltage distributions for cell voltages in different states for a retry soft decision read, in accordance with some embodiments of the present disclosure.

FIG. 3 is a graph 300 of cell voltage distributions 302, 304, 306, 308 for cell voltages in different states for a retry soft decision read in accordance with some embodiments of the present disclosure. During read retries, soft decision data is generated by applying additional reference voltages 340, 342, 344, 346, 348, 350 in addition to reference voltages $V_0$ 320, $V_1$ 322 and $V_2$ 324. By performing additional read operations using different reference voltages (e.g., 344, 346), additional regions or states are defined, such as main state $S_0$ 326, $S_1$ 330, $S_2$ 332, and $S_3$ 334, and new intermediate states $e_1$ 360, $e_2$ 362, $e_3$ 364, $e_4$ 366, $e_5$ 370, and $e_6$ 372. Each is assigned a state value (e.g., {111}, {011}, {001}).

For example, when reading a least significant bit page, reference voltages 344, 322, 346 are applied in a series of read operations to determine if the least significant bit is a "0", with the memory cell in either state $S_2$ 332, or $S_3$ 334, or if the least significant bit is a "1", with the memory cell in either state $S_0$ 326, $S_1$ 330. Given three reference voltages 344, 322, 346, the hard decisions will have three bit values. Although reference voltages can be applied in a number of different orders, affecting the hard decision results, one example of the hard decision values for three reference voltages 344, 322, 346 applied in that order is as follows. If the read voltage is below all three reference voltages 344, 322, 346 to the left of reference voltage 344, the hard decision is ({111}. If the read voltage is above reference voltage 344 and below reference voltages 322, 346, the hard decision is {011}. If the read voltage is above reference voltages 344, 322 and below reference voltage 346, the hard decision is {001}. If the read voltage is above all three reference voltages 344, 322, 346, the hard decision is {000}. The hard decision can be generated bit by bit by applying each of the three reference voltages 344, 322, 346 in three successive read operations.

When reading a most significant bit page, reference voltages 340, 320, 342 and 348, 324, 350 are applied in a series of read operations to determine if the most significant bit is a "0", with the memory cell in either state $S_1$ 330 or $S_2$ 332, or if the most significant bit is a "1", with the memory cell in either state $S_0$ 326 or $S_3$ 334. If the read voltage is below reference voltage 340, the hard decision is {111}. If the read voltage is between reference voltages 340 and 320, the hard decision is {011}. If the read voltage is between reference voltages 320 and 342, the hard decision is {001}. If the read voltage is between reference voltages 342 and 348, the hard decision is {000}. If the read voltage is between reference voltages 348 and 324, the hard decision is {100}. If the read voltage is between reference voltages 324 and 350, the hard decision is {110}. If the read voltage is above reference voltage 350, the hard decision is {111}.

Notably, the likelihood that the value read from a memory cell is correct differs based on the state that is read. For example, if the read retry results in a hard decision corresponding to state $S_0$ 326, the likelihood that the memory cell actually contains the value associated with target state voltage level 312 is greater than if the read retry results in a hard decision corresponding to state $e_1$ 360, because state $S_0$ 326 is further from the intersection of distributions 302 and 304 than state $e_1$ 360.

The hard decisions of read operations can be converted into soft decisions (log likelihood ratio values) based on the knowledge of the channel. The hard decision for state $S_0$ 326 will therefore have a higher log likelihood value than the hard decision for state $e_1$ 360. A log likelihood ratio for a memory cell contains the likelihood for each possible value of the memory cell that the cell contains that value. Thus, given a four state memory cell, the corresponding log likelihood ratio for data stored in the memory cell will have four probability or likelihood values, each giving the likelihood that the memory cell contains one of the four possible values. The log likelihood ratio values are generated from the read retry operation hard decisions in any suitable manner. Based upon the disclosure provided herein, one of ordinary skill in the art will recognize a variety of techniques and equations for calculating log likelihood ratio values from the read retry operation hard decisions. In some embodiments, the log likelihood ratio values are pre-calculated for each possible read retry operation hard decision, based on expected channel characteristics, and stored in a lookup table for use during operation.

In some embodiments, when data from a read retry operation fails to converge in the decoder, another read retry operation is triggered, with a greater number of reference voltages applied, giving higher quality soft decisions to be provided to the decoder. Such a process of increasing the number of reference voltages can be continued as long as desired until a maximum number of retries is reached and a read failure is signaled.

The adjustment of read retry reference voltages disclosed herein adjusts the reference voltages to achieve a prescribed log likelihood ratio table that is designed to achieve low density parity check decoding convergence with a lower number of read retries.

Initially, the location of the intersections between distributions (e.g., 302, 304) is not known. If the read reference voltages are positioned so that read values are captured near the center of distributions (e.g., 302), the full range of the resulting log likelihood ratios will not be used and the hard read bit error rate will not be minimized. For example, if log likelihood ratios are represented using three signed bits, the range of possible log likelihood ratios is from −7 to 7. In one or more embodiments, channel tracking is performed and an algorithm is applied to inversely find the read reference voltages that will use the full resolution of possible log likelihood ratios, rather than concentrating the log likelihood ratios at the edges of the available range.

In some embodiments, the channel tracking-based read reference voltage adjustment is applied in a read retry operation. In these embodiments, a hard read is performed first, reading hard decisions and decoding those hard decisions. The hard decisions can be mapped to log likelihood ratio values for a low density parity check decoder with a soft information input, by mapping a 0 value from the memory cell to a large negative log likelihood ratio value corresponding to a 0 value, and mapping a 1 value from the memory cell to a large positive log likelihood ratio value corresponding to a 1 value.

If the decoding fails, then the read retry operation is initiated, and a soft read is performed, yielding soft information or log likelihood ratios that are decoded. In a soft read, multiple reads of a page are performed at different read reference voltages to obtain a quantized version of the stored voltage on the memory cell. The multi-bit read patterns from the memory cell are mapped to log likelihood ratios that represent the confidence level of the bit value being 0 or 1, using a lookup table. The log likelihood ratios are passed to a decoder, such as, but not limited to, a low density parity check decoder performing soft decoding, to recover the written data. An algorithm is implemented to inversely identify the reference voltages that will populate the lookup table, under the assumption that the read voltage distributions have a substantially Gaussian distribution.

In some embodiments, the algorithm to inversely identify the reference voltages that will populate the lookup table to map to log likelihood ratios is a greedy algorithm, meaning that it considers all possible values of the read reference voltages before reaching a solution for the read reference voltages to be used. It is also an inverse algorithm, meaning that it starts with the possible log likelihood ratios and then identifies the read reference voltages that will result in quantized voltages that map to log likelihood ratios that use the full resolution. By utilizing the full log likelihood ratio resolution, the low density parity check decoding is able to converge on the correct written values in a lower number of read retries. With proper choice of read reference voltages, it is observed that the limited spectrum of log likelihood ratios does not impair performance of the low-density parity-check decoder. In some embodiments, the low density parity check decoding comprises a min-sum decoding algorithm, although the channel tracking-based read retry voltage adjustment is not limited to use with any particular type of decoder.

Figure 4:
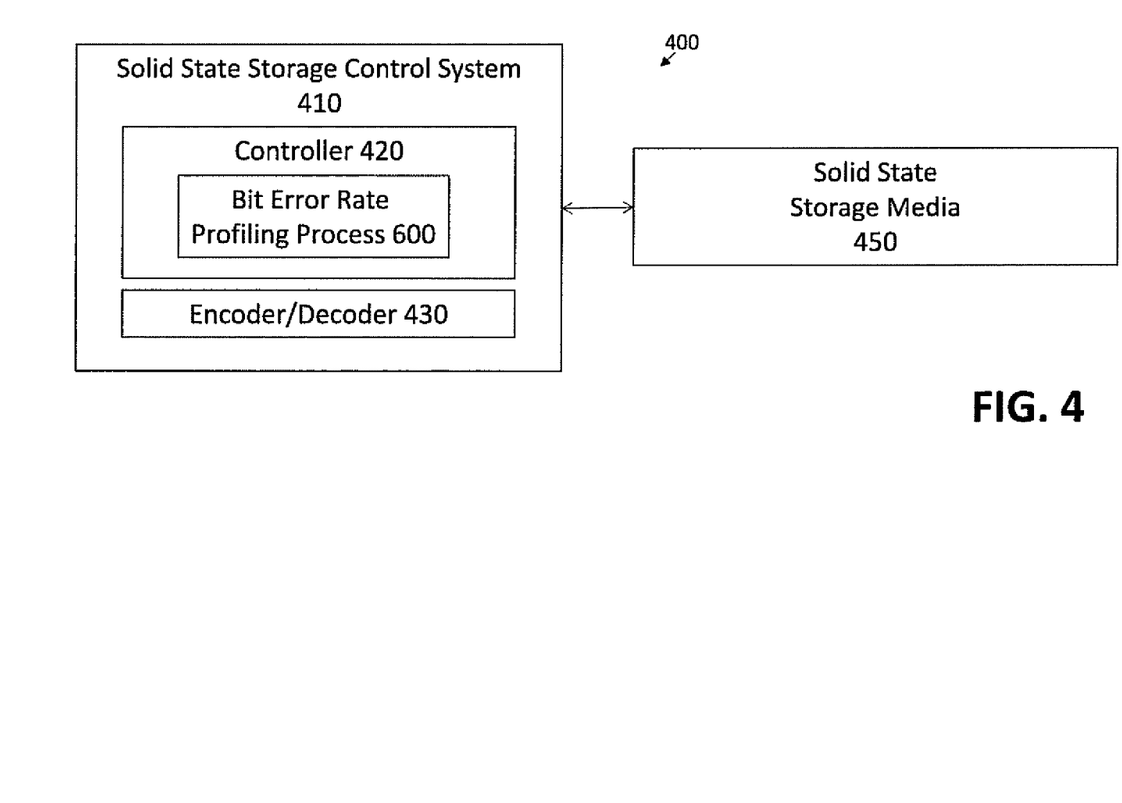
FIG. 4 is a schematic block diagram of a solid state storage system, in an illustrative embodiment of the present disclosure.

FIG. 4 is a schematic block diagram of an illustrative solid state storage system 400. As shown in FIG. 4, the illustrative solid state memory system 400 comprises a solid state storage control system 410 and a solid state storage media 450. The exemplary solid state storage control system 410 comprises a controller 420 and an encoder/decoder block 430. In an alternative embodiment, the encoder/decoder block 430 may be implemented inside the controller 420.

As shown in FIG. 4, the controller 420 comprises a bit error rate profiling process 600, discussed below in conjunction with FIG. 6, to implement the bit error rate profiling techniques described herein. The encoder/decoder block 430 may be implemented, for example, using well-known commercially available techniques and/or products. The encoder within the encoder/decoder block 430 may implement, for example, error correction encoding, such as a low-density parity-check (LDPC) encoding. The decoder within the encoder/decoder block 430 may be embodied, for example, as a hard decision decoder, such as a hard decision low-density parity-check (HLDPC) decoder.

The solid state storage media 450 comprises a memory array, such as a single-level or multi-level cell flash memory, a NAND flash memory, a phase-change memory (PCM), a magneto-resistive random access memory (MRAM), a nano RAM (NRAM), a NOR (Not OR) flash memory, a dynamic RAM (DRAM) or another non-volatile memory (NVM). While the disclosure is illustrated primarily in the context of a solid state storage device (SSD), the disclosed bit error rate profiling techniques can be applied in solid state hybrid drives (SSHD) and other storage devices, as would be apparent to a person of ordinary skill in the art based on the present disclosure.

Figure 5:
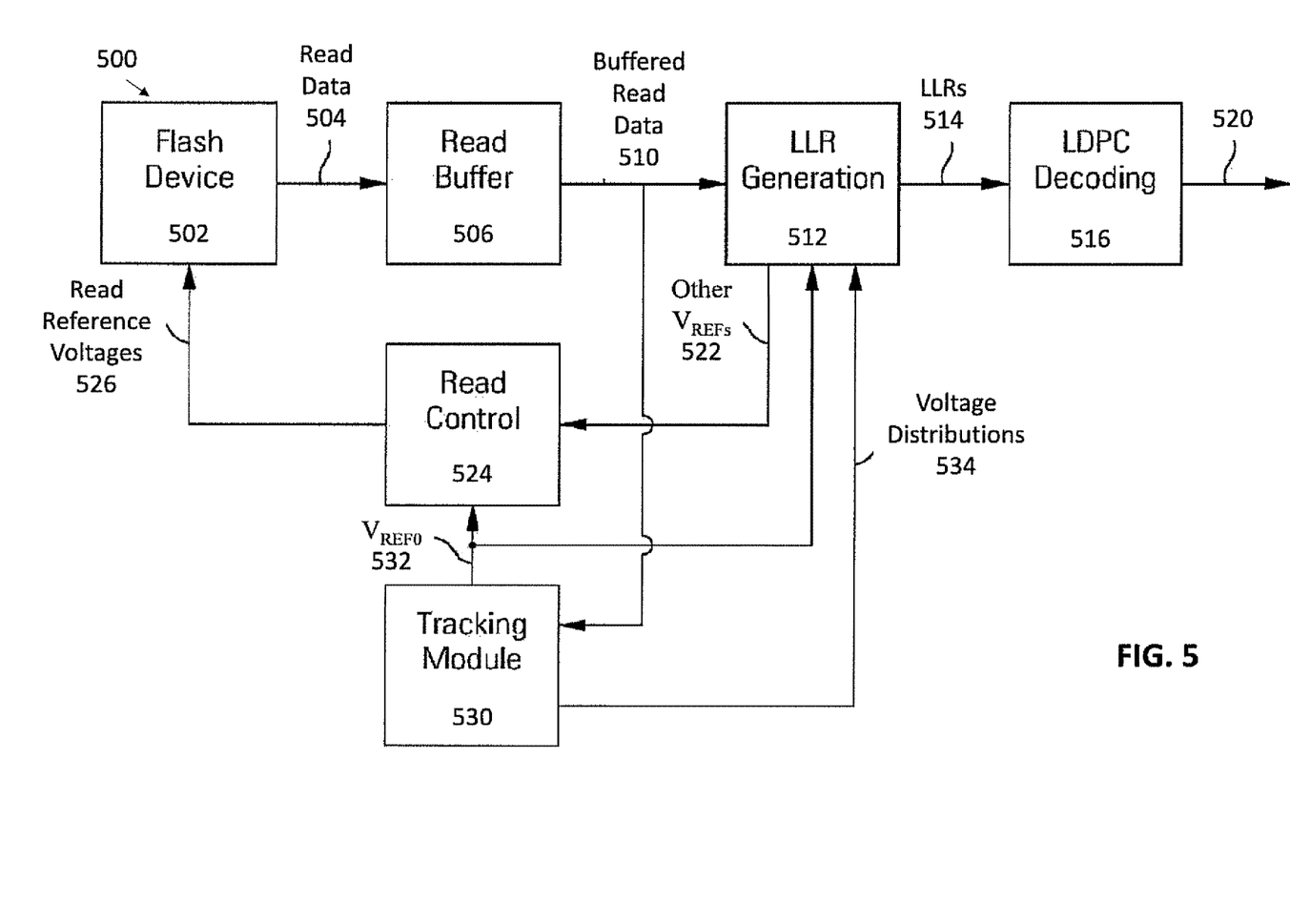
FIG. 5 illustrates a flash channel read path with adaptive read threshold voltage tracking, in accordance with some embodiments of the present disclosure.

FIG. 5 illustrates a flash channel read path 500 with channel tracking-based read retry voltage adjustment in accordance with some embodiments of the present disclosure. The read path 500 includes a flash device having an array of memory cells, or any other type of non-volatile memory. Based upon the disclosure provided herein, one of ordinary skill in the art will recognize a variety of storage technologies that can benefit from the bit error rate-based read threshold voltage adjustments disclosed herein.

Read reference voltages 526 are applied to the flash device 502 by a read control device 524 in a series of N reads. Each memory cell is read N times, and the N reads result in read data 504 containing N bits per memory cell as a quantized version of the stored voltage on the memory cell. The read data 504 is buffered in a read buffer 506, and buffered read data 510 from read buffer 506 is provided to a log likelihood ratio generation circuit 512 (or likelihood generator, which can also be adapted to use plain likelihood values). The N bits for a memory cell are mapped to LLRs 514 for the memory cell in log likelihood ratio generation circuit 512. In some embodiments, the log likelihood ratio generation circuit 512 contains a lookup table that maps the read patterns in buffered read data 510 to log likelihood ratios. The log likelihood ratio generation circuit 512 generates LLRs 514 that are processed by an LDPC decoding module 516 to generate a decoded value 520, in a known matter.

A tracking module 530 receives the buffered read data 510 from the read buffer 506, or from any other suitable source. Generally, channel tracking techniques adapt to the changes in read threshold voltages to maintain a desired performance level. Adaptive tracking algorithms typically track variations in the solid state storage channel and consequently, help to maintain a set of updated channel parameters. The updated channel parameters are used, for example, to adjust read threshold voltages. United States Published Patent Application No. 2013/0343131, filed Jun. 26, 2012, entitled "Fast Tracking For Flash Channels," and/or United States Published Patent Application No. 2015/0287453, entitled "Optimization of Read Thresholds for Non-Volatile Memory," (now U.S. Pat. No. 9,595,320) incorporated by reference herein in their entirety, disclose techniques for adapting read threshold voltages.

The tracking module 530 identifies the intersection point between neighboring voltage distributions (e.g., 302, 304) for a memory cell that corresponds to zero log likelihood ratio, and provides read reference voltage level $V_{REF0}$ 532, including the read reference voltage $V_{REF0}$ corresponding to the intersection. When the read reference voltage $V_{REF0}$ corresponding to the intersection is used for the soft read operation, it will result in a reduction in the bit error rate. The read reference voltage $V_{REF0}$ is used in some embodiments as the first read reference voltage of a read retry operation, and additional read reference voltages around $V_{REF0}$ to obtain substantially all possible log likelihood ratio values. The tracking module 530 thus generates the read reference voltage level $V_{REF0}$ 532 to be used in read retry operations. In other embodiments $V_{REF0}$ may not correspond to the intersection of the distributions depending on the tracking algorithm design, tracking inaccuracy, or the actual channel distributions deviating from Gaussian behavior in either the peak or the tail. In other situations, $V_{REF0}$ may coincide with the intersection of the distributions but may not be applied first and that would be accounted for in the calculations in 512 and 524.

The tracking module 530 also tracks the voltage distributions 534 (e.g., 302, 304). In some embodiments, the tracking module 530 calculates the voltage distribution means and variances for each voltage distribution 534 corresponding to each possible state in each memory cell. The voltage distributions 534 can be calculated in any suitable manner based on the read data. As an example, the tracking module 530 can operate as disclosed in U.S. Published Patent Application No. 2013/0343131, filed Jun. 26, 2012, entitled "Fast Tracking for Flash Channels," incorporated by reference herein in its entirety. In some embodiments, the tracking module 530 tracks intersections without estimating means or variances.

For a two-state memory cell, or single-level memory cell, the tracking module 530 estimates the means and variances of the voltage distributions of states "1" and "0", as well as the read reference voltage $V_{REF0}$ that most reduces the bit error rate and which likely lies at the intersection of those distributions when 0's and 1's are equally likely in the written data.

The tracking module 530 provides the voltage distributions 534 to the log likelihood ratio generation circuit 512 for use in updating the log likelihood ratio lookup table. The log likelihood ratio generation circuit 512 is used to calculate likelihood values for decoding purposes. The log likelihood ratio generation circuit 512 also determines where to place the other N−1 read reference voltages around $V_{REF0}$ 532 based on the voltage distributions 534 and on the read reference voltage $V_{REF0}$ 532 to obtain substantially all possible log likelihood ratio values when the read patterns in buffered read data 510 are mapped to log likelihood ratios. The log likelihood ratio generation circuit 512 determines where to place the other N−1 read reference voltages around $V_{REF0}$ 532, updates the lookup table, and provides the N−1 read reference voltage levels 522 to a read controller 524. It is important to note that the division of functionality is not limited to the example embodiments disclosed herein. For example, in other embodiments, the tracking module 530 calculates and provides read reference voltages around $V_{REF0}$ 532 and provides those voltages to the log likelihood ratio generation circuit 512, rather than the log likelihood ratio generation circuit 512 determining where to place the other N−1 read reference voltages around $V_{REF0}$ 532, and these divisions of functionality are to be seen as equivalent.

The read reference voltages are stored in log likelihood ratio generation circuit 512 in some embodiments, as calculated based on the log likelihood ratio lookup table in log likelihood ratio generation circuit 512 and on the voltage distribution means and variances 534 from tracking module 530.

The read controller 524 controls read retry operations in the flash device 502, providing each of the N read reference voltages (including $V_{REF0}$ 532) to be used when reading the memory cells in the flash device 502. The read controller 524 initiates N reads of a page, with the first read using read reference voltage $V_{REF0}$ in some embodiments, and with the subsequent N−1 reads at read references voltages around $V_{REF0}$ as determined by log likelihood ratio generation circuit 512.

Figure 6:
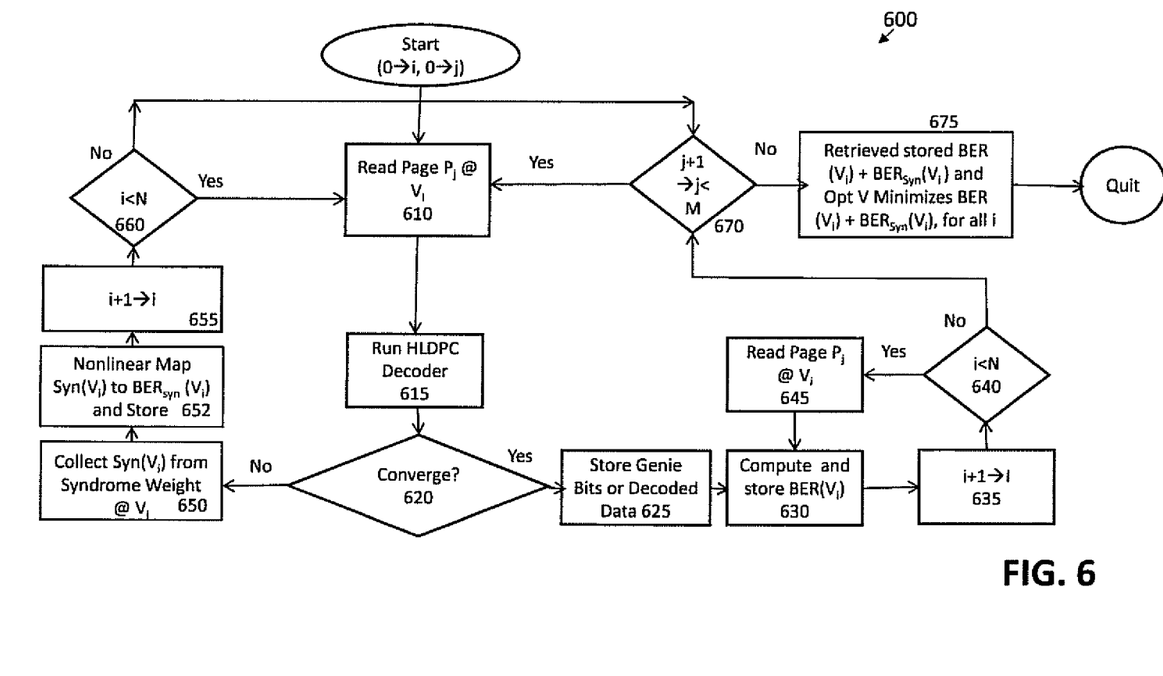
FIG. 6 is a flow chart illustrating an exemplary implementation of a bit error rate profiling process using a non-linear syndrome weight mapping, according to one embodiment of the disclosure.

FIG. 6 is a flow chart illustrating an exemplary bit error rate profiling process 600 incorporating aspects of the present invention. Generally, the exemplary bit error rate profiling process 600 allows the tracking module 530 to update the bit error rate based on a determined bit error rate with respect to a specific $V_{ref}$. As shown in FIG. 6, when the exemplary read threshold voltage adjustment process 600 is initiated, counters i and j are initialized to zero. A given page $P_j$ is read during step 610 at a current read threshold voltage $V_i$ to obtain a read value.

A hard decision decoder, such as a hard decision low-density parity-check decoder, is applied to the read value during step 615. A test is performed during step 620 to determine if the hard decision decoder converges for the read value to a converged word. If it is determined during step 620 that the hard decision decoder converges for the read value to a converged word, then the converged word (e.g., decoded data) is stored as genie bits (e.g., reference bits) during step 625. In addition, a bit error rate for the current read threshold voltage $V_i$ is computed during step 630 based on the reference bits stored during step 625. The bit error rate is computed by comparing a read value bit-by-bit against genie bits and the resultant number of mismatches is the number of bit errors. The bit error rate is the number of bit errors expressed as a fraction of the number of Genie Bits.

The read threshold voltage counter (i) is incremented during step 635 and a further test is performed during step 640 to determine if the read threshold voltage counter (i) remains less than a threshold limit, N (e.g., a limit on the number of read threshold voltages attempted). If it is determined during step 640 that the read threshold voltage counter (i) remains less than the threshold limit, then the given page $P_j$ is read during step 645 for the new read threshold voltage $V_i$ to obtain a new read value.

If it was determined during step 640 that the read threshold voltage counter (i) is not less than a threshold limit, program control proceeds to step 670, discussed below.

If it was determined during step 620 that the hard decision decoder does not converge for the read value to a converged word for the permitted number of read threshold voltage attempts, then program control optionally proceeds to step 650 to add the syndrome weight at the current read threshold voltage $V_i$ to a syndrome weight profile Syn ($V_i$). Generally, a syndrome is an estimate of the number of bits in error, in a known manner. The syndrome weight can be obtained, for example, from a syndrome weight calculator or a hard decision decoder for a specified number of iterations.

The syndrome weight profile Syn ($V_i$) is mapped to a bit error rate (BER) profile $BER_{Syn}(V_i)$ during step 652, as follows. Consider a (N,K,p) LDPC code, having a column weight J, a row weight L after user shortening, and the code rate R=K/N, where N is the length of the codeword, K is the length of user data, and p equals N−K parity bits.

Alternatively, the code rate can be expressed, as follows:

R=1−J/L.

In addition, the probability of a given syndrome weight can be expressed, as follows:

$P$syn=(Syndrome weight)/($p$), and the bit error rate can be expressed, as follows:

BER=$Pb$=(# of bit errors)/$N$.

Using a Binomial assumption, the probability of a given syndrome weight can be expressed, as follows:

$$Psyn = P(\text{a check is unsatisfied}) = \sum_{i:odd}^{L} \binom{L}{i} P_b^i (1-P_b)^{L-i}$$

$$Psyn = (1/2) \times 2 \times \sum_{i:odd}^{L} \binom{L}{i} P_b^i (1-P_b)^{L-i}$$

$$Psyn = (1/2) \times \left[ \sum_{i:odd}^{L} \binom{L}{i} P_b^i (1-P_b)^{L-i} + \sum_{i=0}^{L} \binom{L}{i} P_b^i (1-P_b)^{L-i} - \sum_{i:even}^{L} \binom{L}{i} P_b^i (1-P_b)^{L-i} \right]$$

$$Psyn = (1/2) \times \left[ 1 - \left( \sum_{i:even}^{L} \binom{L}{i} P_b^i (1-P_b)^{L-i} + \sum_{i:odd}^{L} \binom{L}{i} (-P_b^i)(1-P_b)^{L-i} \right) \right]$$

$$Psyn = \left(\frac{1}{2}\right) \times \left[ 1 - \left( \sum_{i=0}^{L} \binom{L}{i} (-P_b^i)(1-P_b)^{L-i} \right) \right]$$

$$Psyn = \left(\frac{1}{2}\right) \times [1 - (1 - P_b + P_b)^L] = \left(\frac{1}{2}\right) \times [1 - (1 - 2P_b)^L]$$

The bit error rate can be obtained using the following non-linear mapping of the syndrome weights (e.g., as an average over multiple pages):

$$P_b^i = \left(\frac{1}{2}\right) \times [1 - (1 - 2P_{syn})^{1/L}]$$

In addition, using the first term in a Taylor series expansion, for small Psyn, the bit error rate can be expressed using a linear approximation, as follows:

$$P_b \approx \frac{P_{syn}}{L} = \frac{P_{syn}}{JN/p} =$$

$pP_{syn}/jN$ = (Syndrome weight/column weight)/code-word length

The above equation compensates for shortened code rate, so that estimated BER of different code rates can be combined.

The read threshold voltage counter (i) is incremented during step 655 and a further test is performed during step 660 to determine if the read threshold voltage counter (i) remains less than the threshold limit, N. If it is determined during step 660 that the read threshold voltage counter (i) remains less than the threshold limit, then the given page $P_j$ is read again during step 610 for the new read threshold voltage $V_i$ to obtain a new read value. The hard decision decoder is again applied to the current read value during step 615 and the convergence test is performed again during step 620, in the manner described above.

If it was determined during step 640 or 660 that the read threshold voltage counter (i) is not less than a threshold limit, then program control proceeds to step 670. The page counter (j) is incremented during step 670 and a further test is performed during step 670 to determine if the new value of page counter (j) remains less than a page limit, M. If it is determined during step 670 that the new value of page counter (j) remains less than the page limit, then program control proceeds to step 610 and continues in the manner described above to process the next page. If, however, it is determined during step 670 that the new value of the page counter (j) is not less than the page limit, then the stored bit error rate profiles ($BER(V_i)+BER_{Syn}(V_i)$), based on decoded data and the non-linear syndrome weight mapping, respectively, are retrieved during step 675 and the read threshold voltage is selected during step 675 based on the bit error rates computed in the various iterations of steps 630 and/or 650. In at least one embodiment, the read threshold voltage is selected during step 675 that minimizes the stored bit error rate profiles $BER(V_i)$ and/or $BER_{Syn}(V_i)$, for all values of i. The exemplary read threshold voltage adjustment process 600 minimizes one or more bit error rate metrics during step 675 to obtain a substantially optimal read threshold voltage. In one embodiment, the read threshold voltage is optimized during step 675 using only the bit error rate based on the non-linear syndrome weight mapping computed during step 650.

In further variations, syndrome weights can be computed without first checking for convergence in step 620, or syndrome weight-based estimation of error counts can be omitted entirely. Thus, in various implementations, the syndrome weight-based estimation of error counts in step 650 and the bit error rate computation for the current read threshold voltage $V_i$ in step 630 can be performed independently, or can be combined in the manner shown for the exemplary embodiment of FIG. 6.

Figure 7:
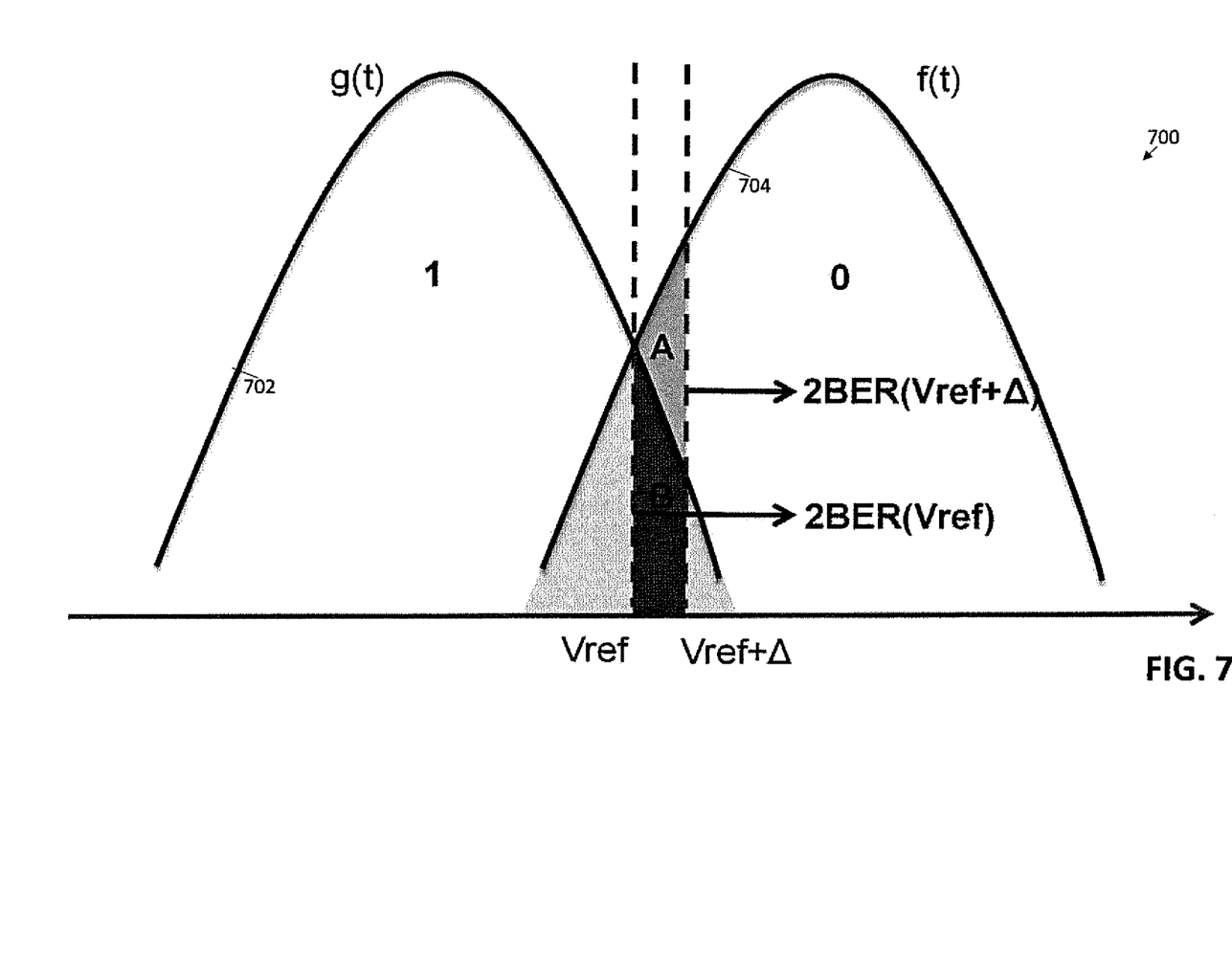
FIG. 7 is a chart of a voltage distribution of a memory cell, in accordance with certain embodiments of the present disclosure.

FIG. 7 is a graph 700 of cell voltage distributions 702, 704, for a normal hard decision read in accordance with some embodiments of the present disclosure. The resulting voltages read from the memory cell thus appear something like the distributions 702, 704, shown in the graph 700 of FIG. 7, rather than two distinct discrete voltage levels corresponding to the two states at the target state voltage level.

The BER profile collected by the bit error rate profiling process 600 of FIG. 6 can be used to adaptively map a given cell location to a log likelihood ratio value. As shown in FIG. 7, the voltage distributions of an SLC cell intersect in unreliable regions A and B and it is difficult to estimate A and B directly as the distributions are not measured directly either. Instead, if a BER or syndrome weight profile is used, then A can be estimated as follows:

$$A=2BER(V_{ref}+\Delta)-2BER(V_{ref})\geq 0,$$

while B is estimated from the BER at the intersection point using $B=2\alpha BER(V_{ref})\geq 0$. The unknown that needs to be pre-calculated is $\alpha$, where $0\leq\alpha\leq 1$ and BER(X) denotes BER when X is used as a threshold. Based on the quantities A and B, LLR can be estimated as follows:

$$A = 2BER(V_{ref} + \Delta) - 2BER(V_{ref}), B = 2\alpha BER(V_{ref})$$

$$LLR(V_{ref} + \Delta) = \log(B) - \log(A + B)$$
$$= \log\{\alpha BER(V_{ref})\} - \log\{BER(V_{ref} + \Delta) - (1 - \alpha)BER(V_{ref})\}$$

To match the $LLR(V_{ref}+\Delta)$ of value of "L" from a known look-up table to the decision region represented by A+B, this can be rearranged to give:

$$BER(V_{ref}+\Delta)=\{1+(e^L-1)\alpha\}BER(V_{ref})$$

The previous equation is for an SLC cell, and can easily be extended to an MLC or TLC cell, as would be apparent to a person of ordinary skill in the art, with the following assumptions: (i) the error probability ratio at each $V_{ref}$ offset location in a page is known, and (ii) only neighboring voltage states induce errors into each other. Then, for an MLC/TLC page, the SLC case can be generalized, as follows:

$$BER(V_{ref}+\Delta)=\{1+(e^L-1)\alpha\beta\}BER(V_{ref})$$

where $\beta$ is the error probability ratio at each $V_{ref}$ read window in a page. For example, if an MSB page has two $V_{ref}$s in its read window ($V_a$ and $V_b$), and its total error probability is $P_e$, $V_a$'s error probability is $0.6P_e$, and $V_b$ error probability is $0.4Pe$, then $\beta$ is 0.6 for $V_a$ while it is 0.4 for $V_b$. If it is further assumed that errors occur at each $V_{ref}$ location in a page with equal probability, then, $$\beta = \frac{1}{\#V_{ref}},$$

and hence the only unknown would be $\alpha$. If $\alpha$ is characterized (e.g., offline or at another time), then $\Delta$ can be found be searching numerically for a solution to the relation:

$$BER(V_{ref}+\Delta) = \left\{1 + \frac{(e^L - 1)\alpha}{\#V_{ref}}\right\}BER(V_{ref}).$$

In one or more embodiments, offline or adaptive characterization (on-the-fly) can be used to find $\alpha$ based on retention or PEC values if the distributions can be estimated using reference written data. In that case, states 1 and 0 are distinguishable and the values can be measured, as follows:

$$BER0(V_{ref}) \triangleq \frac{1}{2}Prob(\hat{x}=1 \mid x=0, V_{ref}),$$

$$BER1(V_{ref}) \triangleq \frac{1}{2}Prob(\hat{x}=0 \mid x=1, V_{ref}),$$

$$BER0(V_{ref}+\Delta) \triangleq \frac{1}{2}Prob(\hat{x}=1 \mid x=0, V_{ref}+\Delta), \text{ and}$$

$$BER1(V_{ref}+\Delta) \triangleq \frac{1}{2}Prob(\hat{x}=0 \mid x=1, V_{ref}+\Delta).$$

Then, $\alpha$ can be estimated using:

$$\alpha=1-BER1(V_{ref}+\Delta)/BER1(V_{ref}).$$

Figure 8:
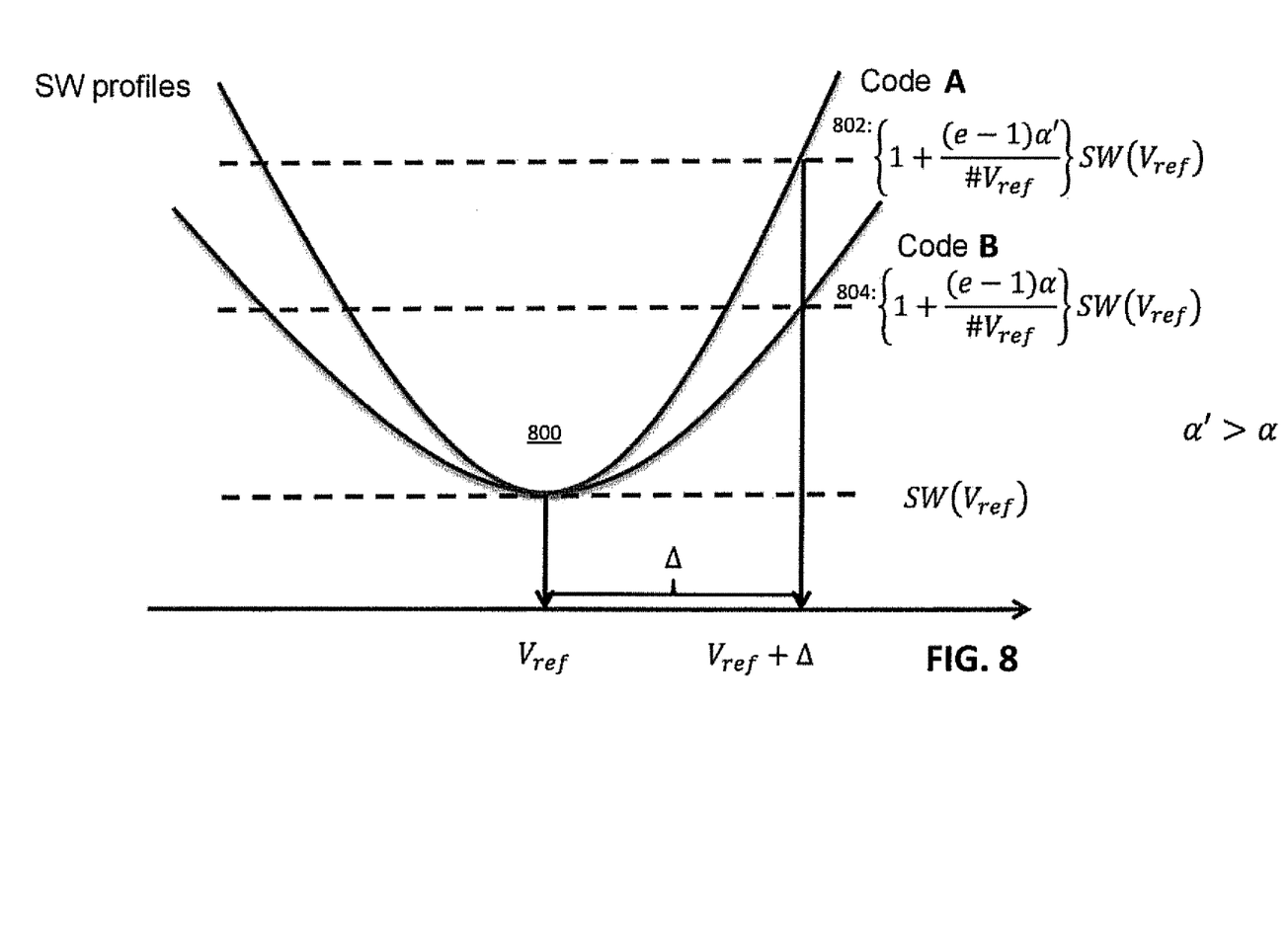
FIG. 8 is a chart of a syndrome weight tracking profile, in accordance with certain embodiments of the present disclosure.

FIG. 8 is a chart of a syndrome weight tracking profile 800, in accordance with certain embodiments of the present disclosure. FIG. 8 shows that $\alpha$ can be computed from the syndrome weight profile 800 using equations 802, 804, and $\alpha$ is also dependent on the LDPC code rate being used to find the syndrome weight profile 800. If the code used has a higher code rate then $\alpha$ would be larger.

Conclusion

In one or more embodiments of the disclosure, syndrome weights for each decoding failure are stored during an adaptive read threshold voltage tracking and a non-linear mapping is used to translate the syndrome weights to a bit error rate. In some embodiments, the syndrome weights are obtained from a soft LDPC decoder or dedicated hardware.

It should be understood that the particular bit error rate profiling arrangements illustrated in FIGS. 1 through 8 are presented by way of illustrative example only, and should not be construed as limiting in any way. Numerous alternative configurations of system and device elements and associated processing operations can be used in other embodiments.

Illustrative embodiments disclosed herein can provide a number of significant advantages relative to conventional arrangements.

For example, one or more embodiments provide significantly improved adaptive voltage tracking techniques since the non-linear mapping of the syndrome weight allows bit error rates for a plurality of pages using different code rates to be combined in a single bit error rate profile. In at least one embodiment, the non-linear mapping of the syndrome weight to obtain a bit error rate profile is used until decoded data is available from a decoder to calculate a bit error rate based on the decoded data.

It is to be appreciated that the particular advantages described above and elsewhere herein are associated with particular illustrative embodiments and need not be present in other embodiments. Also, the particular types of bit error rate profiling features and functionality as illustrated in the drawings and described above are exemplary only, and numerous other arrangements may be used in other embodiments.

As mentioned previously, at least portions of the disclosed bit error rate profiling system may be implemented using one or more processing platforms. A given such processing platform comprises at least one processing device comprising a processor coupled to a memory. The processor and memory in some embodiments comprise respective processor and memory elements of a virtual machine or container provided using one or more underlying physical machines. The term "processing device" as used herein is intended to be broadly construed so as to encompass a wide variety of different arrangements of physical processors, memories and other device components as well as virtual instances of such components. For example, a "processing device" in some embodiments can comprise or be executed across one or more virtual processors. Processing devices can therefore be physical or virtual and can be executed across one or more physical or virtual processors. It should also be noted that a given virtual device can be mapped to a portion of a physical one.

Some illustrative embodiments of a processing platform that may be used to implement at least a portion of an information processing system comprises cloud infrastructure including virtual machines. The cloud infrastructure further comprises sets of applications running on respective ones of the virtual machines. These and other types of cloud infrastructure can be used to provide what is also referred to herein as a multi-tenant environment. One or more system components such as controller 420 and/or encoder/decoder 430, or portions thereof, are illustratively implemented for use by tenants of such a multi-tenant environment.

The disclosed bit error rate profiling arrangements may be implemented using one or more processing platforms. One or more of the processing modules or other components may therefore each run on a computer, storage device or other processing platform element. A given such element may be viewed as an example of what is more generally referred to herein as a "processing device."

Figure 9:
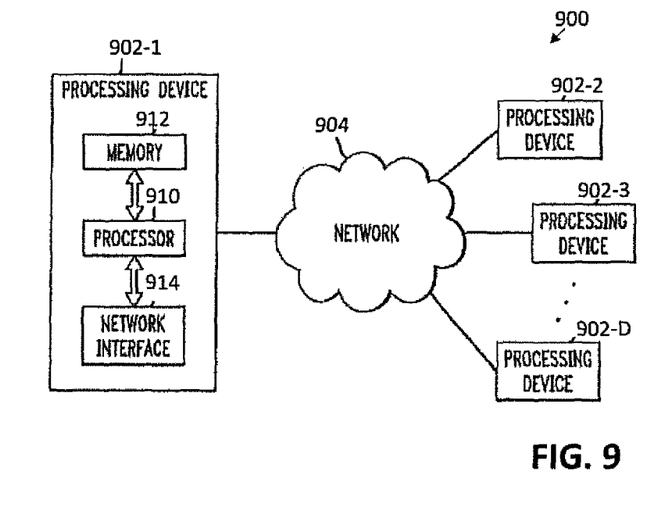
FIG. 9 illustrates a processing platform that may be used to implement at least a portion of one or more embodiments of the disclosure.

Referring now to FIG. 9, one possible processing platform that may be used to implement at least a portion of one or more embodiments of the disclosure is shown. The processing platform 900 in this embodiment comprises at least a portion of the given system and includes at least one processing device(s), denoted 902-1, 902-2, 902-3, . . . 902-D, which communicate with one another over a network 904. The network 904 may comprise any type of network, such as the Internet, a wireless area network (WAN), a local area network (LAN), a satellite network, a telephone or cable network, a cellular network, a wireless network such as WiFi or WiMAX, or various portions or combinations of these and other types of networks.

The processing device 902-1 in the processing platform 900 comprises a processor 910 coupled to a memory 912. The processor 910 may comprise a microprocessor, a microcontroller, an application specific integrated circuit (ASIC), a field programmable gate array (FPGA) or other type of processing circuitry, as well as portions or combinations of such circuitry elements. The memory 912 may comprise random access memory (RAM), read only memory (ROM) or other types of memory, in any combination. The memory 912 and other memories disclosed herein should be viewed as illustrative examples of what are more generally referred to as "processor-readable storage media" storing executable program code of one or more software programs.

Also included in the processing device 902-1 is network interface circuitry 914, which is used to interface the processing device with the network 904 and other system components, and may comprise conventional transceivers.

The other processing devices 902, if any, of the processing platform 900 are assumed to be configured in a manner similar to that shown for processing device 902-1 in the figure.

Again, the particular processing platform 900 shown in the figure is presented by way of example only, and the given system may include additional or alternative processing platforms, as well as numerous distinct processing platforms in any combination, with each such platform comprising one or more computers, storage devices or other processing devices.

Multiple elements of the system may be collectively implemented on a common processing platform of the type shown in FIG. 9, or each such element may be implemented on a separate processing platform.

Articles of manufacture comprising such processor-readable storage media are considered illustrative embodiments. A given such article of manufacture may comprise, for example, a storage array, a storage disk or an integrated circuit containing RAM, ROM or other electronic memory, or any of a wide variety of other types of computer program products. The term "article of manufacture" as used herein should be understood to exclude transitory, propagating signals. Numerous other types of computer program products comprising processor-readable storage media can be used.

Again, the particular processing platform 900 shown in FIG. 9 is presented by way of example only, and the bit error rate profiling system may include additional or alternative processing platforms, as well as numerous distinct processing platforms in any combination, with each such platform comprising one or more computers, servers, storage devices or other processing devices.

It should therefore be understood that in other embodiments different arrangements of additional or alternative elements may be used. At least a subset of these elements may be collectively implemented on a common processing platform, or each such element may be implemented on a separate processing platform.

Also, numerous other arrangements of computers, servers, storage devices or other components are possible in the bit error rate profiling techniques system. Such components can communicate with other elements of the bit error rate profiling system over any type of network or other communication media.

As indicated previously, components of an information processing system as disclosed herein can be implemented at least in part in the form of one or more software programs stored in memory and executed by a processor of a processing device. For example, at least portions of the functionality of the bit error rate profiling process 600 of FIG. 6 are illustratively implemented in the form of software running on one or more processing devices.

It should again be emphasized that the above-described embodiments are presented for purposes of illustration only. Many variations and other alternative embodiments may be used. For example, the disclosed techniques are applicable to a wide variety of other types of information processing systems and bit error rate profiling systems. Also, the particular configurations of system and device elements and associated processing operations illustratively shown in the drawings can be varied in other embodiments. Moreover, the various assumptions made above in the course of describing the illustrative embodiments should also be viewed as exemplary rather than as requirements or limitations of the disclosure. Numerous other alternative embodiments within the scope of the appended claims will be readily apparent to those skilled in the art.

What is claimed is:

1. A device comprising:
a controller configured to obtain a non-linear mapping of a syndrome weight to a bit error rate; and determine, using at least one processing device, a bit error rate for at least one of a plurality of read threshold voltages in a memory using the non-linear mapping of the syndrome weight to the bit error rate for the at least one of the plurality of read threshold voltages.

2. The device of claim 1, wherein the non-linear mapping of the syndrome weight is performed if a hard decision decoder does not converge for a read value obtained for a current read threshold voltage.

3. The device of claim 1, wherein the controller is further configured to merge the determined bit error rate using the syndrome weight in a single bit error rate profile based on bit error rates for the plurality of the read threshold voltages with one or more bit error rates based on decoded data.

4. The device of claim 3, wherein the bit error rate profile is used to adjust the read threshold voltage for the memory.

5. The device of claim 3, wherein the single bit error rate profile is obtained for a plurality of page populations and the single bit error rate profile is processed to select log likelihood ratio values for the plurality of page populations.

6. The device of claim 1, wherein the controller is further configured to determine the bit error rate using the syndrome weight until decoded data is available from a decoder to calculate a bit error rate based on the decoded data.

7. The device of claim 1, wherein the non-linear mapping of the syndrome weight allows bit error rates for a plurality of pages using different code rates to be combined in a single bit error rate profile.

8. The device of claim 1, wherein the non-linear mapping of the syndrome weight allows the bit error rates determined using the syndrome weight to be merged in a single bit error rate profile with bit error rates based on decoded data.

9. The device of claim 1, wherein the syndrome weight is normalized based on a number of parity bits in a parity codeword.

10. A method, comprising:
obtaining a non-linear mapping of a syndrome weight to a bit error rate; and
determining, using at least one processing device, a bit error rate for at least one of a plurality of read threshold voltages in a memory using the non-linear mapping of the syndrome weight to the bit error rate for the at least one of the plurality of read threshold voltages.

11. The method of claim 10, wherein the non-linear mapping of the syndrome weight is performed if a hard decision decoder does not converge for a read value obtained for a current read threshold voltage.

12. The method of claim 10, further comprising a step of merging the determined bit error rate using the syndrome weight in a single bit error rate profile based on bit error rates for the plurality of the read threshold voltages with one or more bit error rates based on decoded data.

13. The method of claim 10, further comprising the step of determining the bit error rate using the syndrome weight until decoded data is available from a decoder to calculate a bit error rate based on the decoded data.

14. The method of claim 10, wherein the non-linear mapping of the syndrome weight allows bit error rates for a plurality of pages using different code rates to be combined in a single bit error rate profile.

15. A non-transitory machine-readable recordable storage medium, wherein one or more software programs when executed by one or more processing devices implement the steps of the method of claim 10.

16. An apparatus, comprising:
a memory; and
at least one processing device, coupled to the memory, operative to implement the following steps:
obtaining a non-linear mapping of a syndrome weight to a bit error rate; and
determining, using said at least one processing device, a bit error rate for at least one of a plurality of read threshold voltages in a memory using the non-linear mapping of the syndrome weight to the bit error rate for the at least one of the plurality of read threshold voltages.

17. The apparatus of claim 16, wherein the non-linear mapping of the syndrome weight is performed if a hard decision decoder does not converge for a read value obtained for a current read threshold voltage.

18. The apparatus of claim 16, wherein the at least one processing device is further configured to merge the determined bit error rate using the syndrome weight in a single bit error rate profile based on bit error rates for the plurality of the read threshold voltages with one or more bit error rates based on decoded data.

19. The apparatus of claim 16, wherein the at least one processing device is further configured to determine the bit error rate using the syndrome weight until decoded data is available from a decoder to calculate a bit error rate based on the decoded data.

20. The apparatus of claim 16, wherein the non-linear mapping of the syndrome weight allows bit error rates for a plurality of pages using different code rates to be combined in a single bit error rate profile.

* * * * *